(12) United States Patent
Huangfu et al.

(10) Patent No.: US 9,680,131 B2
(45) Date of Patent: Jun. 13, 2017

(54) ORGANIC LIGHT-EMITTING DIODE (OLED) PANEL, MANUFACTURING METHOD THEREOF AND DISPLAY DEVICE

(71) Applicant: BOE TECHNOLOGY GROUP CO., LTD., Beijing (CN)

(72) Inventors: Lujiang Huangfu, Beijing (CN); Wenyu Ma, Beijing (CN); Lei Shi, Beijing (CN); Can Zhang, Beijing (CN); Yinan Liang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 14/437,134

(22) PCT Filed: Aug. 21, 2014

(86) PCT No.: PCT/CN2014/084920
§ 371 (c)(1),
(2) Date: Apr. 20, 2015

(87) PCT Pub. No.: WO2015/161595
PCT Pub. Date: Oct. 29, 2015

(65) Prior Publication Data
US 2016/0126503 A1    May 5, 2016

(30) Foreign Application Priority Data
Apr. 24, 2014 (CN) .......................... 2014 1 0169083

(51) Int. Cl.
*H01L 51/52* (2006.01)
*H01L 51/56* (2006.01)
*H01L 27/32* (2006.01)

(52) U.S. Cl.
CPC ...... *H01L 51/5271* (2013.01); *H01L 27/3244* (2013.01); *H01L 51/56* (2013.01); *H01L 2227/323* (2013.01); *H01L 2251/5361* (2013.01)

(58) Field of Classification Search
USPC .............................................. 257/40; 438/27
See application file for complete search history.

(56) References Cited

U.S. PATENT DOCUMENTS

2005/0263786 A1    12/2005    Isoda
2006/0245188 A1    11/2006    Takenaka
(Continued)

FOREIGN PATENT DOCUMENTS

CN    1535094 A    10/2004
CN    1604349 A    4/2005
(Continued)

OTHER PUBLICATIONS

Sep. 2, 2015—(CN)—Third Office Action Appn 201410169083.7 with English Tran.
(Continued)

*Primary Examiner* — Jaehwan Oh
*Assistant Examiner* — Lawrence Tynes, Jr.
(74) *Attorney, Agent, or Firm* — Banner & Witcoff, Ltd.

(57) ABSTRACT

An organic light-emitting diode (OLED) panel, a manufacturing method thereof and a display device are provided. The OLED panel comprises: a base substrate, a plurality of OLED units formed on the base substrate, and a reflective structure formed on the base substrate, disposed along the periphery of the OLED units and configured to partially or completely encircle the OLED units. The OLED unit includes an anode layer, an organic emission layer and a cathode layer. The reflective structure is provided with a reflective surface which is configured to reflect light emitted
(Continued)

from a side terminal of the organic emission layer to the outside of the OLED panel. The OLED panel can improve the utilization rate of light emitted by the OLED units and hence improve the display quality of the OLED panel.

11 Claims, 4 Drawing Sheets

(56) References Cited

U.S. PATENT DOCUMENTS

| | | | | |
|---|---|---|---|---|
| 2007/0103062 | A1* | 5/2007 | Jung | H01L 51/5271 |
| | | | | 313/504 |
| 2008/0290796 | A1* | 11/2008 | Chan | H01L 27/3272 |
| | | | | 313/504 |
| 2008/0296600 | A1 | 12/2008 | Kwack et al. | |
| 2013/0112960 | A1 | 5/2013 | Chaji et al. | |

FOREIGN PATENT DOCUMENTS

| | | |
|---|---|---|
| CN | 1855480 A | 11/2006 |
| CN | 101164379 A | 4/2008 |
| CN | 102297345 A | 12/2011 |
| CN | 103000639 A | 3/2013 |
| CN | 203165897 U | 8/2013 |
| CN | 103296018 A | 9/2013 |
| CN | 103715372 A | 4/2014 |
| CN | 103996693 A | 8/2014 |

OTHER PUBLICATIONS

Jan. 26, 2015—International Search Report for Appn PCT/CN2014/084920 with Eng Tran of Written Opinion.
Dec. 24, 2014—(CN)—First Office Action for Appn 201410169083.7 with Eng Tran.
May 4, 2015—(CN)—Second Office Action for Appn 201410169083.7 with Eng Tran.

* cited by examiner

ORGANIC LIGHT-EMITTING DIODE (OLED) PANEL, MANUFACTURING METHOD THEREOF AND DISPLAY DEVICE

The application is a U.S. National Phase Entry of International Application No. PCT/CN2014/084920 filed on Aug. 21, 2014, designating the United States of America and claiming priority to Chinese Patent Application No. 201410169083.7 filed on Apr. 24, 2014. The present application claims priority to and the benefit of the above-identified applications and the above-identified applications are incorporated by reference herein in their entirety.

TECHNICAL FIELD

At least one embodiment of the present invention relates to an organic light-emitting diode (OLED) panel, a manufacturing method thereof and a display device.

BACKGROUND

OLED unit is an organic thin film electroluminescent (OTFEL) device and has the advantages of simple manufacturing process, low cost, high luminous efficiency, easy forming of a flexible structure, wide viewing angle, etc. Therefore, the display technology employing OLEDs has become important display technology.

The OLED unit includes an anode layer, a cathode layer and an organic emission layer. There is specific voltage difference between the anode layer and the cathode layer to excite the organic emission layer to emit light.

SUMMARY

At least one embodiment of the present invention provides an OLED panel, a manufacturing method thereof and a display device to improve the utilization rate of light emitted by OLED units, the luminous efficiency of the OLED panel and the display quality of the OLED panel.

In one aspect, at least one embodiment of the present invention provides an OLED panel, which comprises: a base substrate, a plurality of OLED units formed on the base substrate, and a reflective structure formed on the base substrate, disposed along the periphery of the OLED units and configured to partially or completely encircle the OLED units. The OLED unit includes an anode layer, an organic emission layer and a cathode layer, and the reflective structure is provided with a reflective surface which is configured to reflect light emitted from a side terminal of the organic emission layer to the outside of the OLED panel.

In another aspect, at least one embodiment of the present invention provides a display device, which comprises the foregoing OLED panel.

In still another aspect, at least one embodiment of the present invention provides a method for manufacturing an OLED panel, which comprises: forming an OLED unit on a base substrate, in which the OLED unit includes an anode layer, an organic emission layer and a cathode layer; and forming a reflective structure on the base substrate, in which the reflective structure is disposed along the periphery of the OLED unit and configured to partially or completely encircle the OLED unit and is provided with a reflective surface which is configured to reflect light emitted from a side terminal of the organic emission layer to the outside of the OLED panel.

BRIEF DESCRIPTION OF THE DRAWINGS

Simple description will be given below to the accompanying drawings of the embodiments to provide a more clear understanding of the technical proposals of the embodiments of the present invention. Obviously, the drawings described below only involve some embodiments of the present invention but are not intended to limit the present invention.

REFERENCE NUMERALS

1—Base Substrate; 2—OLED Unit; 21—First Insulating Substrate; 22—Anode Layer; 23—Organic Emission Layer; 24—Cathode Layer; 3—Reflective Structure; 31—Second Insulating Substrate; 311—Opening; 32—Metal Layer; 4—Pixel Electrode; 5—First Photoresist Layer; 6—First Mask; 7—Through Hole; 8—Second Photoresist Layer; 9—Second Mask

DETAILED DESCRIPTION

For more clear understanding of the objectives, technical proposals and advantages of the embodiments of the present invention, clear and complete description will be given below to the technical proposals of the embodiments of the present invention with reference to the accompanying drawings of the embodiments of the present invention. Obviously, the preferred embodiments are only partial embodiments of the present invention but not all the embodiments. All the other embodiments obtained by those skilled in the art without creative efforts on the basis of the embodiments of the present invention illustrated shall fall within the scope of protection of the present invention.

The inventors of the application have noted that: as the organic emission layer of an OLED unit is usually encapsulated between the cathode layer and the anode layer, no matter a light-emitting surface of the OLED unit is disposed on one side of the cathode layer or one side of the anode layer, as the refractive index of the cathode layer or the anode layer is much greater than the refractive index of air, most light emitted by the organic emission layer will be fully reflected on the surface and hence propagated in the organic emission layer. Thus, the light extraction of the OLED unit is lower and is generally less than 20%, and hence the utilization rate of the light emitted by the OLED unit can be reduced and the display quality of the OLED panel can be affected.

Embodiment 1

Figure 1:
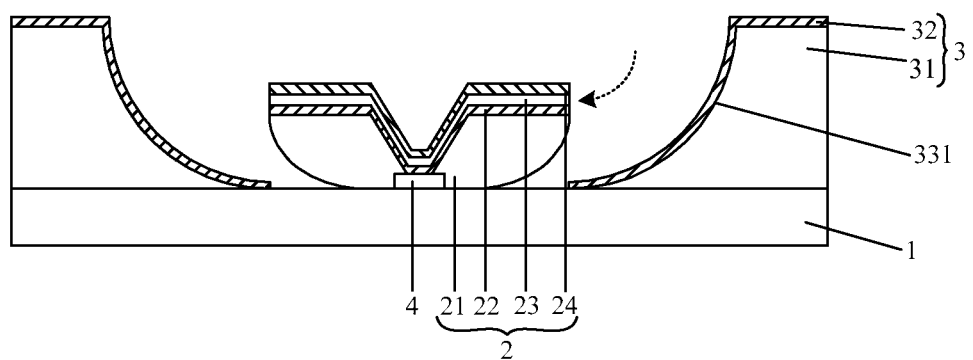
FIG. 1 is a schematic structural view 1 of an OLED panel provided by an embodiment of the present invention.

The embodiment of the present invention provides an OLED panel. As illustrated in FIG. 1, the OLED panel comprises: a base substrate 1, a plurality of OLED units 2 formed on the base substrate 1, and reflective structures 3 formed on the base substrate 1, disposed along the periphery of the OLED units 2 and configured to partially or completely encircle the OLED units 2. The OLED unit 2 includes an anode layer 22, an organic emission layer 23 and a cathode layer 24. In one example, the OLED panel may further comprise a first insulating substrate 21 configured to support the anode layer, the organic emission layer and the cathode layer. The reflective structure 3 is provided with a reflective surface which is configured to reflect light emitted from a side terminal of the organic emission layer 23 to the outside of the OLED panel.

It should be noted that: as illustrated by the dashed arrow in FIG. 1, the foregoing side terminal of the organic emission layer 23 refers to an unsealed side surface of the organic emission layer 23. Obviously, as the side surface is unsealed, the light emitted by the organic emission layer 23 is emitted from the side terminal while unable to be emitted from the light-emitting surface of the OLED.

The embodiment of the present invention provides an OLED panel. The OLED panel comprises OLED units and reflective structures disposed along the periphery of the OLED units and configured to partially or completely encircle the OLED units. The reflective structure is provided with a reflective surface which is configured to reflect light emitted from a side terminal of the organic emission layer to the outside of the OLED panel. Obviously, light which cannot be emitted from a light-emitting surface of the OLED can be emitted from the side terminal of the organic emission layer. Therefore, the arranged reflective structure can fully utilize the light emitted by the organic emission layer of the OLED, and hence the display effect of a display device can be improved.

Figure 2:
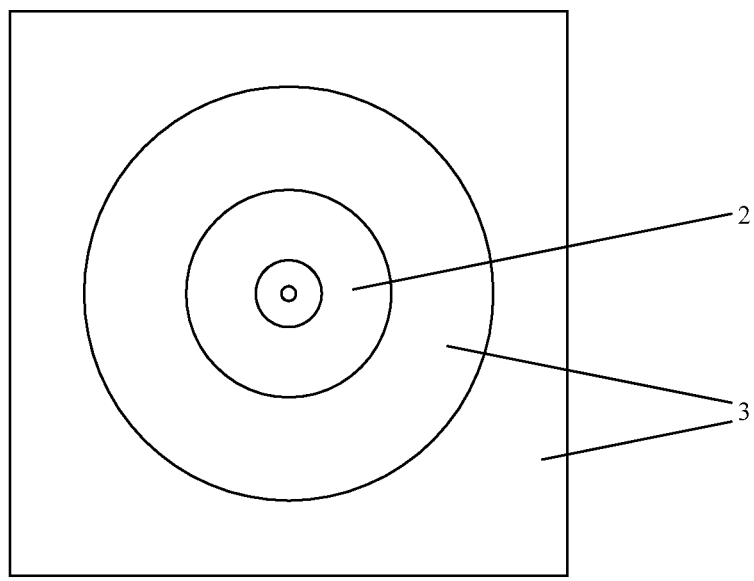
FIG. 2 is a schematic top view 1 of FIG. 1 of the embodiment of the present invention.
Figure 3:
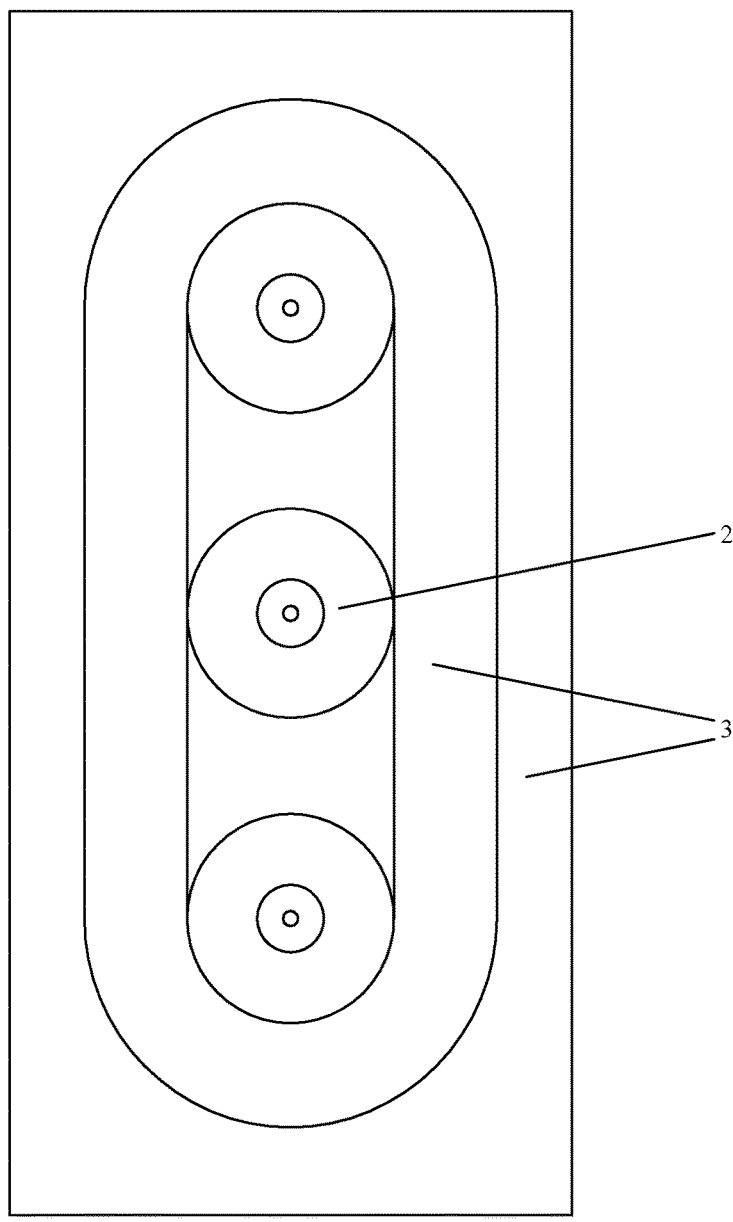
FIG. 3 is a schematic top view 2 of FIG. 1 of the embodiment of the present invention.

For instance, as illustrated in FIG. 2, the reflective structure 3 may be disposed along the periphery of the OLED unit 2, namely completely encircling the OLED unit 2; or as illustrated in FIG. 3, the reflective structure 3 may be only disposed on both sides of the OLED unit 2, namely partially encircling the OLED unit 2.

In one example, as illustrated in FIG. 3, in order to reduce the manufacturing costs and simultaneously improve the compactness of the arrangement of the OLED units 2 on the OLED panel, a plurality of OLED units 2 may be disposed in the same reflective structure 3.

In one example, as illustrated in FIG. 1, the reflective structure 3 includes a second insulating substrate 31 and a metal layer 32. The second insulating substrate 31 is disposed on the periphery or both sides of the OLED unit 2. The metal layer 32 is formed on a surface of the second insulating substrate 31. One surface of the metal layer 32 facing the OLED unit 2 is the foregoing reflective surface.

As illustrated in FIG. 1, in order to ensure that the light emitted from the side terminal of the organic emission layer 23 can be reflected to the outside of the OLED panel by the reflective surface of the reflective structure 3, the second insulating substrate 31 is provided with an opening 311 which partially or completely encircles the OLED unit 2. The area of a bottom surface of the opening 311 is less than that of a top surface. Moreover, a vertical projection of the top surface covers the bottom surface, namely the shape of the opening 311 is similar to a horn mouth.

In one example, as illustrated in FIG. 1, obviously, the height of the second insulating substrate 31 is greater than that of the OLED unit 2, which may ensure that the light emitted by the organic emission layer 23 of the OLED unit 2 can be fully reflected to the outside of the OLED panel by the reflective surface of the reflective structure 3.

For instance, the surface of the second insulating substrate 31 may be in the shape of a plane surface, a stepped surface, a wavy surface, etc. In view of the manufacturing process and the reflection effect, in one example, the surface of the opening 311 may be a cambered surface. The cambered surface can be realized by adopting appropriate photoresist, corporation with an appropriate mask together with the control of the exposure intensity, and hence the shape of the opening 311 meeting the requirement can be directly formed after one patterning process.

Considering the factors such as conductivity, manufacturing costs, service life and the like, an anode layer 22 in an OLED unit is generally formed by an indium tin oxide (ITO)/silver/ITO three-layer structure. Obviously, the anode layer 22 formed by the structure has good reflecting capacity. Therefore, in one example of the embodiment of the present invention, in order to reduce the manufacturing difficulty and the manufacturing costs, the metal layer 32 and the anode layer 22 may be formed in the same patterning process. As the metal layer 32 and the anode layer 22 are formed in the same patterning process and the height of the second insulating substrate 32 is greater than that of the first insulating substrate 21, the electric insulation between the metal layer 32 and the anode 22 may be easily realized by utilization of the height difference.

In one example, the organic emission layer 23 at least includes a hole transport layer (HTL), an emission layer (EML) and an electron transport layer (ETL). In the case of appropriate voltage between the anode layer 22 and the cathode layer 24, positive holes in the HTL and negative charges in the ETL are combined in the EML to drive the EML to emit light.

It should be noted that as organic materials suitable for electron transport are not necessarily suitable for hole transport, the ETL and the HTL of the organic emission layer may be made from different organic materials or organic materials doped with different impurities. The currently common materials for preparing the ETL have high film-forming stability and good thermal stability and electron transport property and usually comprise fluorescent dye compounds such as anthracene diazole derivatives, naphthalene ring-containing derivatives, 1-naphthyl and 3-methylphenyl. The materials for preparing the HTL belong to an aromatic amine fluorescent compound such as 1-naphthyl and other organic materials.

The materials of the organic emission layer 23 have the characteristics of strong fluorescence, good carrier transport property, good thermal stability and chemical stability, high quantum efficiency and capability of being subjected to vacuum deposition under solid state, and, for instance, may comprise 8-hydroxyquinoline aluminum salt. In one example, in order to ensure the display effect, the organic emission layer 23 capable of emitting white light may be adopted.

It should be noted that the base substrate 1 in the embodiment of the present invention not only includes a substrate for support such as a glass substrate and a crystal substrate but also includes layer structures disposed on the substrate, e.g., layer structures such as thin-film transistors (TFTs) and gate electrode circuits. No further description will be given here.

An embodiment of the present invention further provides a display device, which comprises the foregoing OLED panel. The display device may be any display device such as a mobile phone, a table PC, a TV and a notebook computer.

Embodiment 2

Figure 4:
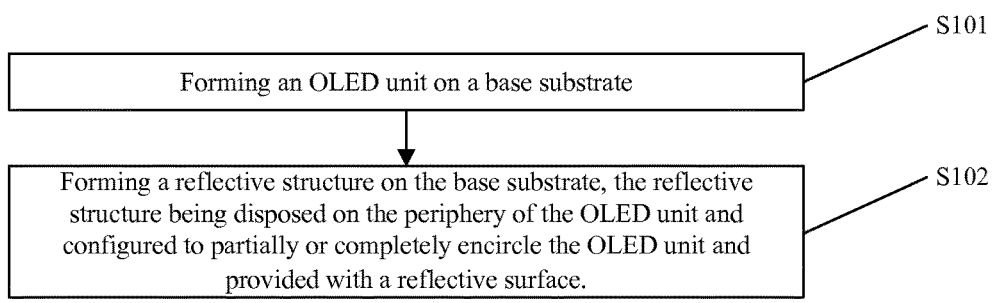
FIG. 4 is a flowchart 1 of a method for manufacturing an OLED panel provided by an embodiment of the present invention.

The embodiment of the present invention provides a method for manufacturing an OLED panel. As illustrated in FIG. 4, the method comprises the following steps.

Step S101: forming an OLED unit on a base substrate.

Step S102: forming reflective structures on the base substrate, in which the reflective structure is disposed along the periphery of the OLED unit and configured to partially or completely encircle the OLED unit and is provided with a reflective surface.

In one example, the OLED unit includes an anode layer, an organic emission layer and a cathode layer. The reflective surface is configured to reflect light emitted from a side terminal of the organic emission layer to the outside of the OLED panel. In one example, the OLED unit may further include a first insulating substrate configured to support the anode layer, the organic emission layer and the cathode layer.

Figure 5:
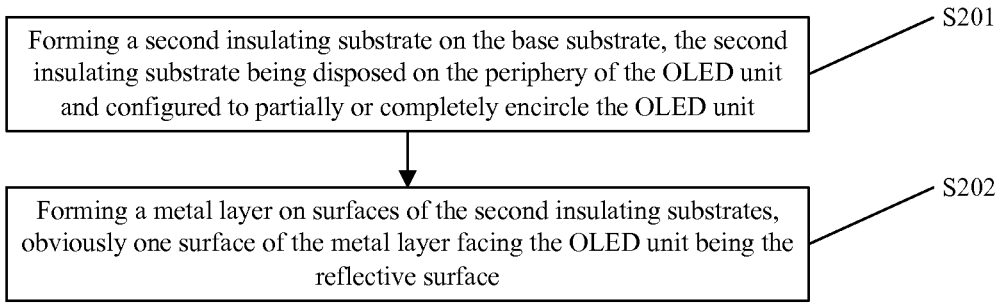
FIG. 5 is a flowchart 2 of a method for manufacturing the OLED panel provided by an embodiment of the present invention.

In one example, as illustrated in FIG. 5, the step S102 may include the following steps.

Step S201: forming a second insulating substrate on the base substrate, in which the second insulating substrate is disposed along the periphery of the OLED unit and configured to partially or completely encircle the OLED unit.

Step S202: forming a metal layer on surfaces of the second insulating substrate. Obviously, one surface of the metal layer facing the OLED unit acts as the reflective surface.

In one example, in order to ensure the refection effect of the reflective surfaces, the step S201 may include: forming the second insulating substrate and forming an opening in the second insulating substrate. The opening partially or completely encircles the OLED unit. The area of a bottom surface of the opening is less than that of a top surface. Moreover, a vertical projection of the top surface covers the bottom surface.

In one example, the surface of the opening 311 is a plane, a stepped surface, a wavy surface or a cambered surface.

In one example, the height of the second insulating substrate 31 is greater than that of the OLED unit 2.

Detailed description will be given below to the method for manufacturing the OLED panel as shown in FIG. 1 provided by the embodiment of the present invention.

Figure 6:
FIG. 6 is a schematic structural view 2 of the OLED panel provided by an embodiment of the present invention.
Figure 6:
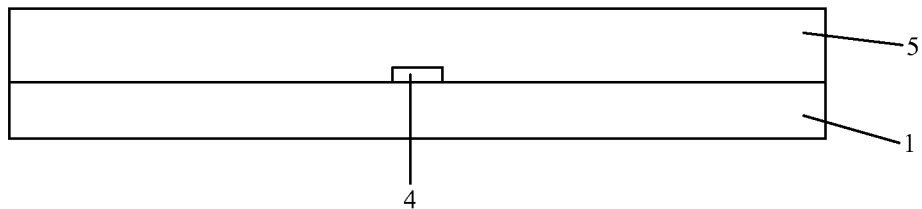
Figure 7:
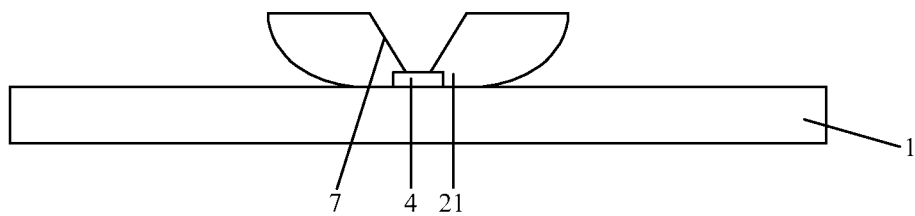
FIG. 7 is a schematic structural view 3 of the OLED panel provided by an embodiment of the present invention.

As illustrated in FIG. 6, on the basis of the base substrate 1 including a pixel electrode 4, a first photoresist layer 5 is formed and a patterning process is conducted with a first mask 6 to form a pattern of a first insulating substrate 21 and a pattern of a through hole 7 passing through the first insulating substrate 21. As illustrated in FIG. 7, the first insulating substrate 21 is configured to support structures such as an anode layer 22, an organic emission layer 23 and a cathode layer 24 in an OLED unit 2. The through hole 7 is arranged corresponding to the pixel electrode 4 and is conducive to the electrical connection between the anode layer 22 of the OLED unit 2 and the pixel electrode 4.

In one example, in view of the alignment accuracy of the first mask 6 and the difficulty of the manufacturing process, the first photoresist layer 5 may be formed of negative photoresist.

Figure 8:
FIG. 8 is a schematic structural view 4 of the OLED panel provided by an embodiment of the present invention.
Figure 8:
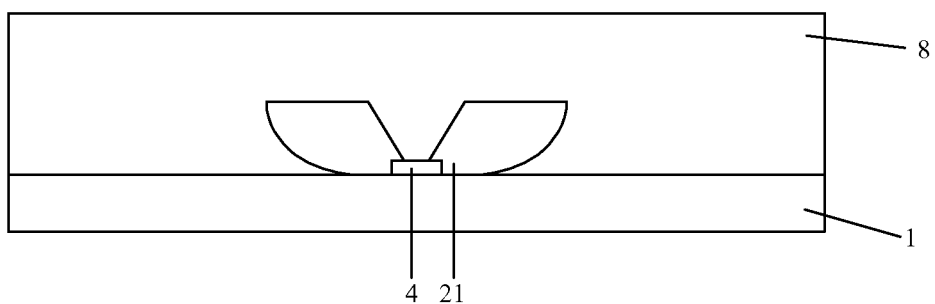
Figure 9:
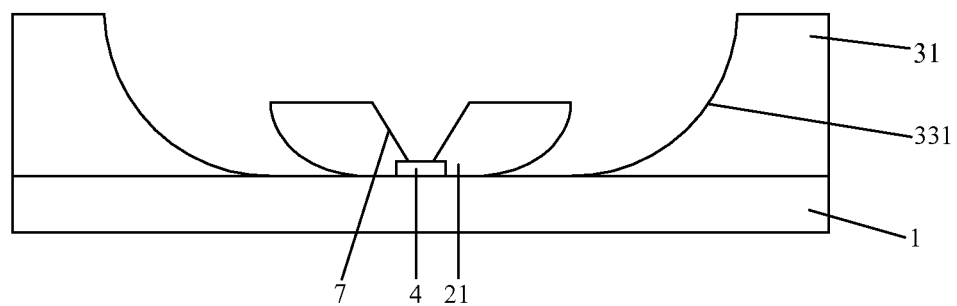
FIG. 9 is a schematic structural view 5 of the OLED panel provided by an embodiment of the present invention.

In one example, as illustrated in FIG. 8, on the basis of the OLED panel as shown in FIG. 6, a second photoresist layer 8 is formed. Similarly, a pattern of an opening 311 of the second insulating substrate 31 is formed with a second mask 9. In one example, as illustrated in FIG. 9, the height of the second insulating substrate 31 is greater than that of the first insulating substrate 21. Similarly, in view of the alignment accuracy of the second mask 9 and the difficulty of the manufacturing process, the second photoresist 8 is, for instance, formed of positive photoresist.

Figure 10:
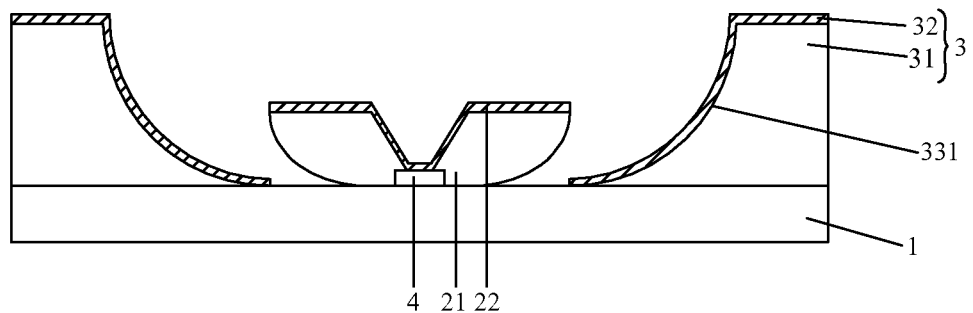
FIG. 10 is a schematic structural view 6 of the OLED panel provided by an embodiment of the present invention.

On the basis of the OLED panel as shown in FIG. 9, a first conductive layer is formed by processes such as deposition and hence subjected to patterning process; and a metal layer 32 of a reflective structure 3 is formed on the second insulating substrate 31, and meanwhile, an anode layer 22 of the OLED unit 2 is formed on the first insulating substrate 21, as shown in FIG. 10. In one example, considering the factors such as conductivity, manufacturing costs and service life, the first conductive layer may be formed of an ITO/silver/ITO three-layer structure. As the metal layer 32 and the anode layer 22 are formed in the same patterning process and the height of the second insulating substrate 21 is greater than that of the first insulating substrate 21, the electric insulation between the metal layer 32 and the anode layer 22 may be easily achieved by utilization of the height difference.

In one example, on the basis of the OLED panel as shown in FIG. 10, the structures such as an organic emission layer 23, a cathode layer 24 and the like are formed, and hence the OLED panel as shown in FIG. 1 can be formed. The manufacturing process is relatively simple and convenient.

The foregoing is only the preferred embodiments of the present invention and not intended to limit the scope of protection of the present invention. Any change or replacement that may be easily thought of by those skilled in the art within the technical scope disclosed by the present invention shall fall within the scope of protection of the present invention. Therefore, the scope of protection of the present invention shall be defined by the appended claims.

The application claims priority to the Chinese patent application No. 201410169083.7 submitted on Apr. 24, 2014. The disclosure content of the Chinese patent application is incorporated by reference herein as part of the application.

The invention claimed is:

1. An organic light-emitting diode (OLED) panel, comprising:
   a base substrate;
   a plurality of OLED units formed on the base substrate, in which each OLED unit includes an anode layer, an organic emission layer and a cathode layer;
   a reflective structure formed on the base substrate, disposed along a periphery of the OLED units and configured to partially or completely encircle the OLED units, in which the reflective structure is provided with a reflective surface which is configured to reflect light emitted from a side terminal of the organic emission layer to the outside of the OLED panel;
   a first insulating substrate configured to support the anode layer, the organic emission layer and the cathode layer; and
   a second insulating substrate and a metal layer, wherein the second insulating substrate is disposed along the periphery of the OLED units and configured to partially or completely encircle the OLED units, the metal layer is formed on a surface of the second insulating substrate, and one surface of the metal layer facing the OLED units is the reflective surface, and
   wherein the first insulating substrate and the second insulating substrate are not in direct contact with each other, and both of the first insulating substrate and the second insulating substrate contact with the base substrate.

2. The OLED panel according to claim 1, wherein the second insulating substrate is provided with an opening which partially or completely encircles the OLED units;
   an area of a bottom surface of the opening is less than that of a top surface; and a vertical projection of the top surface covers the bottom surface.

3. The OLED panel according to claim 2, wherein a surface of the opening is a plane, a stepped surface, a wavy surface or a cambered surface.

4. The OLED panel according to claim 1, wherein a height of the second insulating substrate is greater than that of the OLED units.

5. The OLED panel according to claim 1, wherein the metal layer and the anode layer are formed at the same time.

6. A display device, comprising the OLED panel according to claim 1.

7. A method for manufacturing an organic light-emitting diode (OLED) panel, comprising:
   forming an OLED unit on a base substrate, in which the OLED unit includes an anode layer, an organic emission layer and a cathode layer; and
   forming a second insulating substrate on the base substrate, in which the second insulating substrate is disposed along a periphery of the OLED unit and configured to partially or completely encircle the OLED unit;
   forming a metal layer on a surface of the second insulating substrate, in which one surface of the metal layer facing the OLED unit is a reflective surface, in which the metal layer is disposed along the periphery of the OLED unit and configured to partially or completely encircle the OLED unit and the reflective surface is configured to reflect light emitted from a side terminal of the organic emission layer to the outside of the OLED panel; and
   forming a first insulating substrate configured to support the anode layer, the organic emission layer and the cathode layer,
   wherein the first insulating substrate and the second insulating substrate are not in direct contact with each other, and both of the first insulating substrate and the second insulating substrate are in direct contact with the base substrate.

8. The manufacturing method according to claim 7, wherein the second insulating substrate is formed and an opening of the second insulating substrate is formed and configured to partially or completely encircle the OLED unit; an area of a bottom surface of the opening is less than that of a top surface; and a vertical projection of the top surface covers the bottom surface.

9. The manufacturing method according to claim 8, wherein a height of the second insulating substrate is greater than that of the OLED unit.

10. The manufacturing method according to claim 8, wherein a surface of the opening is a plane, a stepped surface, a wavy surface or a cambered surface.

11. The manufacturing method according to claim 7, wherein the metal layer and the anode layer are formed at the same time.

* * * * *